(12) United States Patent
Sugita et al.

(10) Patent No.: US 10,945,360 B2
(45) Date of Patent: Mar. 9, 2021

(54) COMPONENT MOUNTING POSITIONAL DEVIATION AMOUNT MEASUREMENT UNIT

(71) Applicant: FUJI CORPORATION, Chiryu (JP)

(72) Inventors: Hiroyoshi Sugita, Chiryu (JP); Jun Iisaka, Nissin (JP); Hidetoshi Kawai, Chiryu (JP); Hidetoshi Ito, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 357 days.

(21) Appl. No.: 15/752,602

(22) PCT Filed: Aug. 27, 2015

(86) PCT No.: PCT/JP2015/074151
§ 371 (c)(1),
(2) Date: Feb. 14, 2018

(87) PCT Pub. No.: WO2017/033325
PCT Pub. Date: Mar. 2, 2017

(65) Prior Publication Data
US 2018/0242486 A1    Aug. 23, 2018

(51) Int. Cl.
*B23P 19/00*   (2006.01)
*H05K 13/08*   (2006.01)
(Continued)

(52) U.S. Cl.
CPC .......... *H05K 13/08* (2013.01); *G05B 19/401* (2013.01); *H05K 13/0409* (2018.08); *H05K 13/0417* (2013.01); *H05K 13/089* (2018.08)

(58) Field of Classification Search
CPC .......... H05K 13/0409; H05K 13/0417; H05K 13/08; H05K 13/089; G05B 19/401
See application file for complete search history.

(56) References Cited

U.S. PATENT DOCUMENTS 4,323,306 A * 4/1982 Ito ................. G03G 21/105
                                              15/256.51
5,237,622 A    8/1993 Howell
(Continued)

FOREIGN PATENT DOCUMENTS

JP    2008-205134 A    9/2008
JP    2014-236010 A    12/2014
(Continued)

OTHER PUBLICATIONS

Extended European Search Report dated Jul. 9, 2018 in Patent Application No. 15902294.6.
(Continued)

*Primary Examiner* — Paul D Kim
(74) *Attorney, Agent, or Firm* — Oblon, McClelland, Maier & Neustadt, L.L.P.

(57) ABSTRACT

A component mounting positional deviation amount measurement unit is set in a feeder setting section of a component mounting machine so as to be exchangeable with a cassette-type feeder, and includes measurement nozzle placement sections in which measurement nozzles exchangeably held in a mounting head of the component mounting machine are placed; measurement component placement sections in which measurement components are placed; and a measurement mounting table on which a measurement fiducial mark is provided. When a component mounting positional deviation amount of the component mounting machine is measured, the measurement component is sucked by the measurement nozzle by holding the measurement nozzle in the mounting head, the measurement component is mounted on the measurement mounting table, and a deviation amount of a mounting position of the measurement component with respect to the measurement fiducial mark is measured as a component mounting positional deviation amount of the component mounting machine.

6 Claims, 11 Drawing Sheets

(51) Int. Cl.
*H05K 13/04* (2006.01)
*G05B 19/401* (2006.01)

(56) References Cited

U.S. PATENT DOCUMENTS

| | | | | |
|---|---|---|---|---|
| 5,537,204 A | * | 7/1996 | Woodhouse | ......... H05K 13/089 |
| | | | | 356/243.1 |
| 6,050,151 A | | 4/2000 | Larson | |
| 6,085,573 A | * | 7/2000 | Larson | ............... H05K 13/0818 |
| | | | | 73/1.79 |
| 9,431,783 B1 | * | 8/2016 | Costello | ............... H05K 7/1457 |
| 2008/0185443 A1 | * | 8/2008 | Oonishi | ................. G06K 13/08 |
| | | | | 235/479 |

FOREIGN PATENT DOCUMENTS

| | | |
|---|---|---|
| WO | 2013/186861 A1 | 12/2013 |
| WO | 2015/037099 A1 | 3/2015 |

OTHER PUBLICATIONS

International Search Report dated Nov. 24, 2015 in PCT/JP2015/074151 filed Aug. 27, 2015.

\* cited by examiner

When shutter is open (Proceed to step 112 of fig. 12)

COMPONENT MOUNTING POSITIONAL DEVIATION AMOUNT MEASUREMENT UNIT

TECHNICAL FIELD

The present disclosure relates to a component mounting positional deviation amount measurement unit, which is used for measuring a component mounting positional deviation amount of a component mounting machine, an automatic exchanging system thereof, and a component mounting machine.

BACKGROUND ART

As described in PTL (JP-A-2008-205134), in order to measure a component mounting positional deviation amount of a component mounting machine, a component mounting positional deviation amount measurement unit (accuracy inspection unit) is installed in a vacant space in a component mounting machine and the component mounting positional deviation amount is measured by using the component mounting positional deviation amount measurement unit. The component mounting positional deviation amount measurement unit disclosed in PTL 1 includes a measurement component placement section on which a measurement component (inspection chip) is placed and a measurement mounting table (inspection table) on which a measurement fiducial mark (inspection fiducial mark) is provided. When the component mounting positional deviation amount of the component mounting machine is measured, a measurement component on the measurement component placement section is picked up by a suction nozzle of a mounting head to be mounted on the measurement mounting table, the measurement component and the measurement fiducial mark are captured in a visual field of a camera of the component mounting machine to be imaged, and the captured image is processed to measure a deviation amount of the mounting position of the measurement component with respect to the measurement fiducial mark as the component mounting positional deviation amount of the component mounting machine.

CITATION LIST

Patent Literature

PTL 1: JP-A-2008-205134

SUMMARY

In PTL 1, the component mounting positional deviation amount measurement unit is installed in each of multiple component mounting machines configuring a component mounting line. Therefore, it causes an increase in the manufacturing cost of each component mounting machine. The vacant space within each component mounting machine in which the component mounting positional deviation amount measurement unit is installed is narrow. Therefore, a size of the component mounting positional deviation amount measurement unit which can be installed in each component mounting machine is limited and it is difficult to add a new function. In addition, in order to improve a measurement accuracy of the component mounting positional deviation amount, it is preferable that the suction nozzle of the mounting head of each component mounting machine is exchanged with a measurement nozzle (jig nozzle). However, it is troublesome for an operator to perform an operation of setting the measurement nozzle in a nozzle station (nozzle changer) for each component mounting machine.

In order to solve the problem, a component mounting positional deviation amount measurement unit of the disclosure includes a measurement nozzle placement section in which a measurement nozzle exchangeably held in a mounting head of a component mounting machine is placed; a measurement component placement section in which a measurement component is placed; and a measurement mounting table on which a measurement fiducial mark is provided. When a component mounting positional deviation amount of the component mounting machine is measured, the component mounting positional deviation amount measurement unit is configured to pick up the measurement component by the measurement nozzle by holding the measurement nozzle in the mounting head, mount the measurement component on the measurement mounting table, and measure a deviation amount of a mounting position of the measurement component with respect to the measurement fiducial mark as a component mounting positional deviation amount of the component mounting machine. The component mounting positional deviation amount measurement unit is configured to be set in a feeder setting section of the component mounting machine so as to be exchangeable with a feeder.

The component mounting positional deviation amount measurement unit of the disclosure is set in the feeder setting section of the component mounting machine so as to be exchangeable with the feeder. Therefore, it is possible to reuse one component mounting positional deviation amount measurement unit with respect to multiple component mounting machines, it is unnecessary to provide the component mounting positional deviation amount measurement unit for each component mounting machine, and it is possible to reduce a manufacturing cost of the component mounting machine. In addition, the component mounting positional deviation amount measurement unit of the disclosure may have a size capable of being set in the feeder setting section of the component mounting machine. Therefore, the component mounting positional deviation amount measurement unit can be made larger than the related art and it is also easy to add a new function such as the measurement nozzle placement section in which the measurement nozzle is placed, or the like. Furthermore, the component mounting positional deviation amount measurement unit of the disclosure includes the measurement nozzle placement section. Therefore, it is unnecessary for an operator to set the measurement nozzle in a nozzle station for each component mounting machine and workability can be improved.

In this case, an attaching structure of the component mounting positional deviation amount measurement unit to the feeder setting section may be common to an attaching structure of the feeder. Therefore, it is possible to perform attachment and detachment of the component mounting positional deviation amount measurement unit in the same procedure as attachment and detachment of the feeder and the attachment and detachment of the component mounting positional deviation amount measurement unit are easy.

The mounting head of the component mounting machine is a mounting head that holds only one suction nozzle but there is a mounting head that holds multiple suction nozzles. In the latter case, it is necessary to exchange all the multiple suction nozzles held in the mounting head with the measurement nozzles and to measure the component mounting positional deviation amount for each nozzle.

Considering this point, in the component mounting positional deviation amount measurement unit of the disclosure, the measurement nozzle placement section may be configured to allow placing of the measurement nozzles of at least the number thereof which can be held in the mounting head. The measurement component placement section may be configured to allow placing of the measurement components of at least the number same as the number of the measurement nozzles which can be held in the mounting head. The measurement mounting table is configured to allow mounting of the measurement components of at least the number same as the number of the measurement nozzles which can be held in the mounting head. Therefore, even in a case where multiple suction nozzles are held in the mounting head, a nozzle exchange operation of the measurement nozzle, pickup, a mounting operation, and an imaging operation of the measurement component can be performed collectively for each number of nozzles that can be held in the mounting head. Thus, the measurement of the component mounting positional deviation amount corresponding to the number of nozzles can be efficiently performed. In addition, in a case where the number of the measurement nozzles is smaller than the number of the nozzles that can be held in the mounting head, the measurement of the component mounting positional deviation amount corresponding to the number of the measurement nozzles may be performed, then the positions of the measurement nozzles may be changed, and then the measurement of remaining component mounting positional deviation amounts may be performed.

In addition, in order to correspond to the component mounting machine that holds multiple types of the suction nozzles in the mounting head to be exchangeable, in the component mounting positional deviation amount measurement unit of the disclosure, the measurement nozzle placement section may be configured to allow placing of multiple types of the measurement nozzles, and the measurement component placement section may be configured to allow placing of multiple types of the measurement components which can be sucked by the multiple types of the measurement nozzles. Therefore, also for the component mounting machine that holds the multiple types of the suction nozzles in the mounting head to be exchangeable, the component mounting positional deviation amount of the multiple types of nozzles can be measured for each nozzle type without changing the component mounting positional deviation amount measurement unit for each nozzle type.

Meanwhile, there is a possibility that the measurement component is shifted on the measurement mounting table only by placing the measurement component on the measurement mounting table when the measurement component is mounted.

As a countermeasure against this, a holding device that holds the measurement component mounted (placed) on the measurement mounting table may be provided. Therefore, it is possible to prevent the measurement component from being shifted by the holding device on the measurement mounting table. Here, as the holding device, an electrostatic chuck, a vacuum chuck, or the like may be used.

Furthermore, a shutter mechanism that prevents the measurement nozzle on the measurement nozzle placement section and the measurement component on the measurement component placement section from dropping off when the component mounting positional deviation amount measurement unit is attached and detached, and moved may be provided. Therefore, it is possible to further reliably prevent the measurement nozzle and the measurement component from dropping off by the shutter mechanism when the component mounting positional deviation amount measurement unit is attached and detached, and moved.

In this case, a connector for supplying operation power from a component mounting machine side to a driving source of the shutter mechanism and receiving a signal for controlling an opening and closing operation of the shutter mechanism may be provided in the component mounting positional deviation amount measurement unit. The component mounting positional deviation amount measurement unit may be set to the feeder setting section of the component mounting machine so that the connector is configured to be connected to a connector on the component mounting machine side. Therefore, the connector on the component mounting positional deviation amount measurement unit side can be simultaneously connected to the connector on the component mounting machine side and it is unnecessary to perform connecting work of the connectors after setting of the component mounting positional deviation amount measurement unit by setting the component mounting positional deviation amount measurement unit to the feeder setting section of the component mounting machine.

The exchange work of the component mounting positional deviation amount measurement unit of the disclosure may be manually performed by an operator or may be performed automatically.

An automatic exchanging system that automates the exchange work includes a stock section that stores multiple feeders, which are set in the feeder setting section, and a component mounting positional deviation amount measurement unit; and an exchanging robot that picks up a feeder of an exchanging target from the feeder setting section, collects the feeder in the stock section, picks up a feeder that is designated by a production job from the stock section, and sets the feeder in the feeder setting section. The exchanging robot picks up the component mounting positional deviation amount measurement unit from the stock section and sets the component mounting positional deviation amount measurement unit in an empty slot of the feeder setting section in a case where the component mounting positional deviation amount of the component mounting machine is measured. Therefore, the component mounting positional deviation amount measurement unit and the feeder can be automatically exchanged between the feeder setting section and the stock section during an operation of the component mounting machine, and it is unnecessary for an operator to perform the exchange work of the component mounting positional deviation amount measurement unit and the feeder, and it is possible to save labor.

Furthermore, the exchanging robot may measure a component mounting positional deviation amount of the component mounting machine and then may pick up the component mounting positional deviation amount measurement unit from the feeder setting section, and may collect the component mounting positional deviation amount measurement unit in the stock section. Therefore, it is possible to automate the work of collecting the component mounting positional deviation amount measurement unit in the stock section.

In this case, the exchanging robot and the stock section may be provided in each of the multiple component mounting machines configuring a component mounting line but the exchanging robot and the stock section which are commonly used by the multiple component mounting machines may be provided. Specifically, the stock section may store multiple feeders, which are set in a feeder setting section of the multiple component mounting machines, and the component mounting positional deviation amount measurement unit.

The exchanging robot may pick up a feeder of an exchanging target from the feeder setting section of the multiple component mounting machines, may store the feeder in the stock section, may pick up a feeder that is designated by a production job from the stock section, and may set the feeder in the feeder setting section of the multiple component mounting machines, furthermore, in a case where a component mounting positional deviation amount of any one component mounting machine in the multiple component mounting machines is measured, may pick up the component mounting positional deviation amount measurement unit from the stock section, and may set the component mounting positional deviation amount measurement unit in an empty slot of a feeder setting section of the component mounting machine. Therefore, the exchange work of the component mounting positional deviation amount measurement unit and the feeder with respect to the multiple component mounting machines configuring the component mounting line can be handled by one exchanging robot, a configuration of the component mounting line is simplified, and it is possible to reduce equipment costs.

Also in this case, the exchanging robot may measure a component mounting positional deviation amount of any one of the component mounting machines and then may pick up the component mounting positional deviation amount measurement unit from the feeder setting section of the component mounting machine, and may store the component mounting positional deviation amount measurement unit in the stock section.

Alternatively, in a case where component mounting positional deviation amounts of the multiple component mounting machines are sequentially measured, the exchanging robot may repeat an operation of picking up the component mounting positional deviation amount measurement unit from a feeder setting section of a component mounting machine in which a measurement of a component mounting positional deviation amount is firstly completed, setting the component mounting positional deviation amount measurement unit in a feeder setting section of a component mounting machine of a next measurement order, and measuring a component mounting positional deviation amount of the component mounting machine of the next measurement order, to sequentially measure the component mounting positional deviation amounts of the multiple component mounting machines. Therefore, the component mounting positional deviation amount of the multiple component mounting machines can be sequentially and efficiently performed.

In a case where a component mounting positional deviation amount of the component mounting machine is measured, a component imaging camera and a mark imaging camera equipped in the component mounting machine may be used, the measurement component may be picked up by the measurement nozzle by holding the measurement nozzle in the mounting head, the measurement component may be imaged by the component imaging camera from the lower face side, a captured image thereof may be processed, a deviation amount of a pickup position of the measurement component with respect to the measurement nozzle may be measured, and then the deviation amount of the pickup position may be corrected, the measurement component on the measurement mounting table may be mounted, the measurement component and the measurement fiducial mark in a visual field of the mark imaging camera may be captured and imaged, and a deviation amount of a mounting position of the measurement component with respect to the measurement fiducial mark may be measured. Therefore, the component mounting positional deviation amount can be accurately measured by using the component imaging camera and the mark imaging camera equipped in the component mounting machine.

In this case, an operation of measuring a deviation amount of a mounting position of the measurement component with respect to the measurement fiducial mark may be repeated for a predetermined number of times to calculate an average value of the deviation amount of the mounting position of the measurement component and set the average value as a mounting positional deviation correction amount of a component mounting operation. Therefore, the mounting positional deviation correction amount can be accurately set and the component mounting accuracy can be improved.

DESCRIPTION OF EMBODIMENTS

Hereinafter, an example embodiment of the disclosure will be described. First, a configuration of component mounting line 10 will be described with reference to FIGS. 1 to 3.

Figure 2:
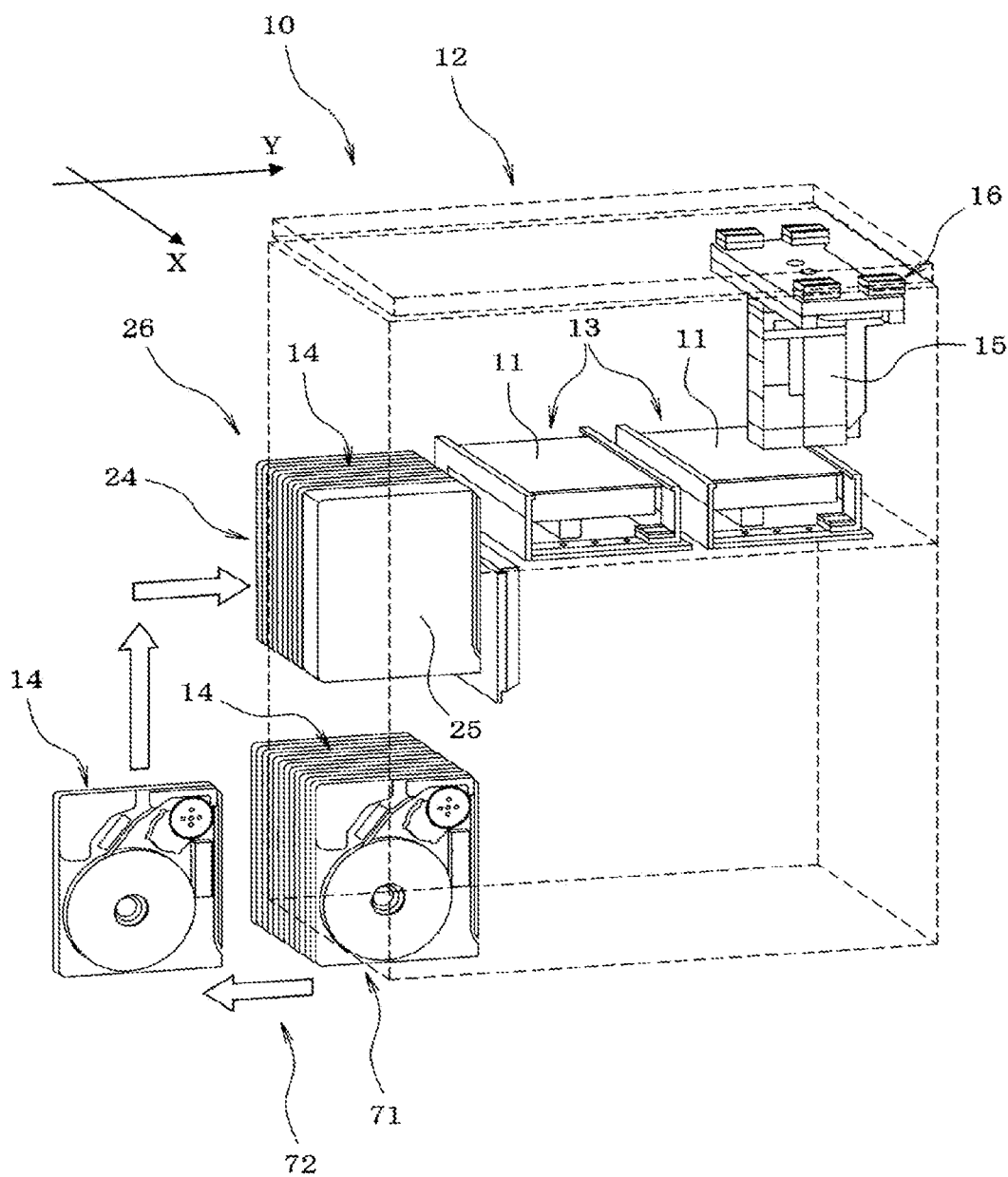
FIG. 2 is a perspective view schematically illustrating a configuration of a component mounting machine with an exchanging robot.
Figure 3:
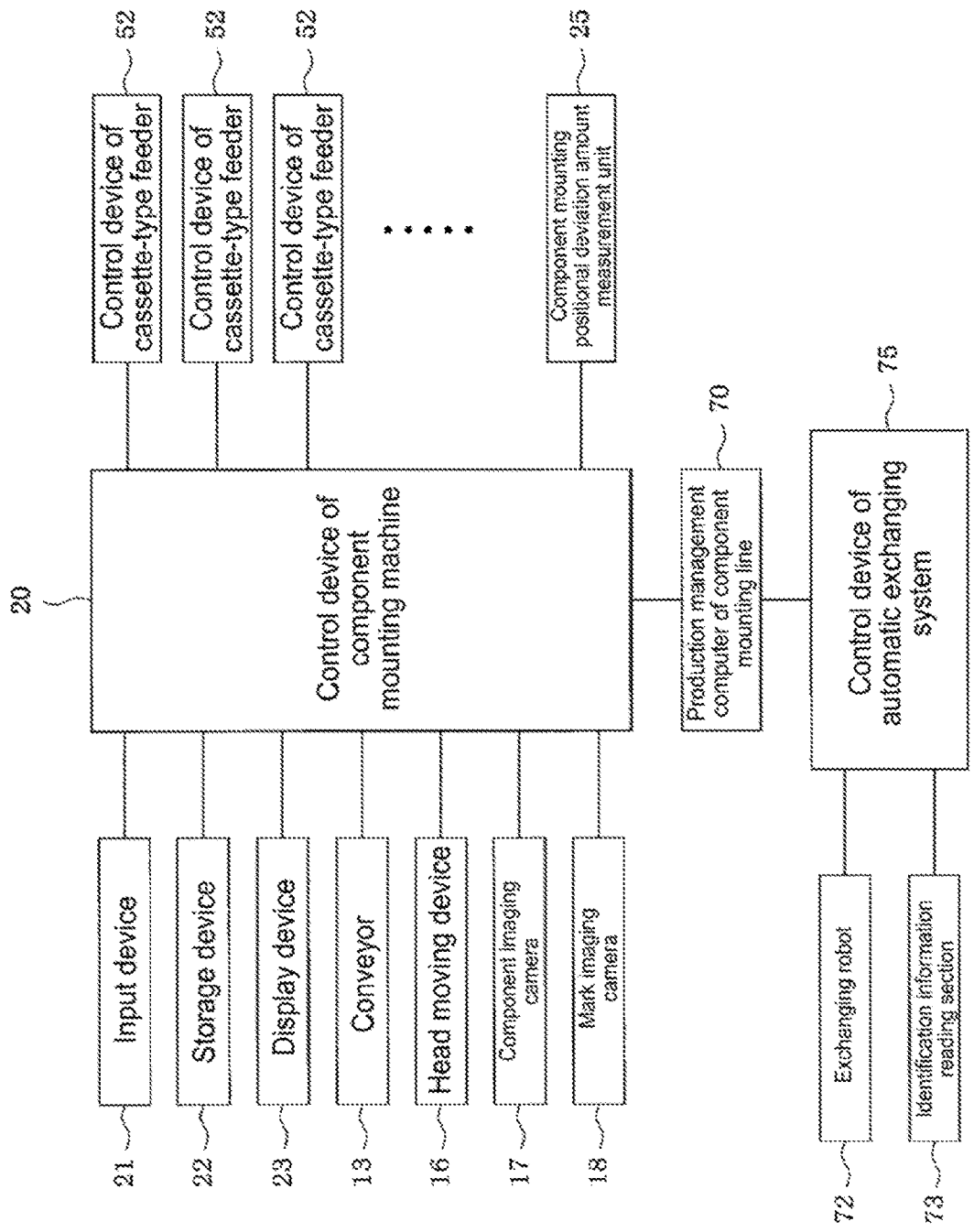
FIG. 3 is a block diagram schematically illustrating a configuration of a control system of a component mounting line with an automatic exchanging system.

Component mounting line 10 is configured by arranging multiple component mounting machines 12 along a conveyance direction (X-direction) of circuit board 11. As illustrated in FIG. 2, each of the component mounting machines 12 includes two conveyors 13 that convey the circuit board 11, mounting head 15 that holds a suction nozzle (not illustrated) which picks up a component supplied from cassette-type feeder 14 and mounts the component on the circuit board 11, head moving device 16 that moves mounting head 15 in XY-directions (left-right direction and front-rear direction), component imaging camera 17 (see FIG. 3) that images a component picked up by a suction nozzle from a lower face side, and the like. Mark imaging camera 18 (see FIG. 3) that images a fiducial mark (not illustrated) of the circuit board 11 is attached to head moving device 16 so as to move integrally with mounting head 15 in the XY-directions. In addition, as illustrated in FIG. 3, input device 21 such as a keyboard, a mouse, or a touch panel, storage device 22 (storage means) such as a hard disk, a RAM, or a ROM which store various control programs, various kinds of data, and the like, display device 23 such as a liquid crystal display or a CRT, and the like are connected to control device 20 of component mounting machine 12. Control device 20 of each of the component mounting machines 12 is connected to production management computer 70 that manages the production of an entirety of component mounting line 10 by a network, and the production of each of the component mounting machines 12 is managed by production management computer 70.

In each of the component mounting machines 12 of component mounting line 10, circuit board 11 conveyed from component mounting machine 12 on an upstream side is conveyed to a predetermined position by conveyor 13, circuit board 11 is clamped by a clamp mechanism (not illustrated) to be positioned, a fiducial mark of circuit board 11 is imaged by mark imaging camera 18 to recognize a position (reference position of circuit board 11) of the fiducial mark. A component supplied from cassette-type feeder 14 is picked up by the suction nozzle of mounting head 15, is moved from a pickup position to an imaging position, and is imaged by component imaging camera 17 from a lower face side to determine a pickup positional deviation amount and the like. Thereafter, the pickup positional deviation amount is corrected and the component is mounted on circuit board 11 on conveyor 13 to produce a component mounting board.

Automatic exchanging system 26, which automatically exchanges cassette-type feeder 14 and component mounting positional deviation amount measurement unit 25 which are set in feeder setting section 24 of each of the component mounting machines 12, is installed on a front face side of component mounting line 10.

Figure 4:
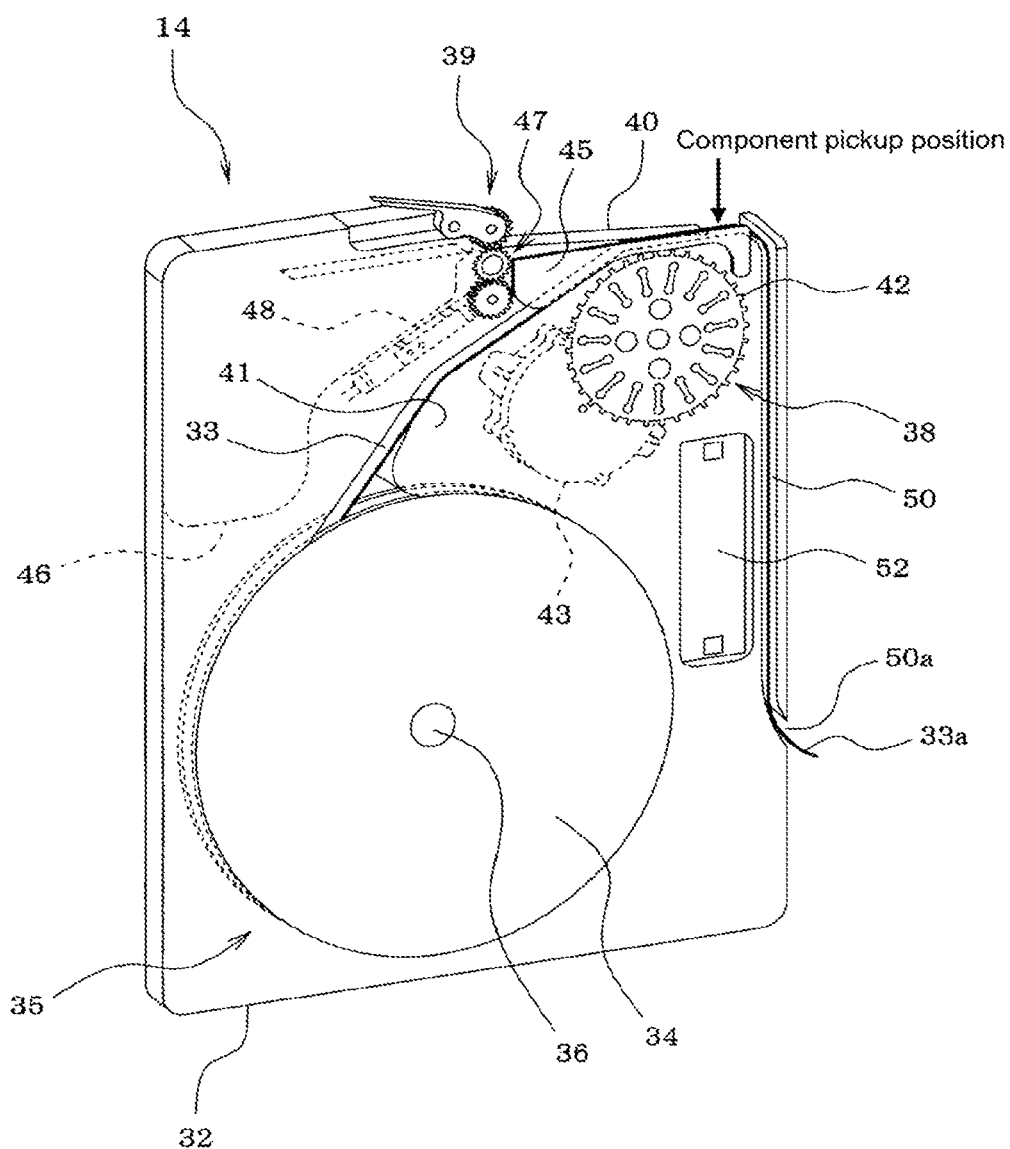
FIG. 4 is a perspective view illustrating a cassette-type feeder.
Figure 5:
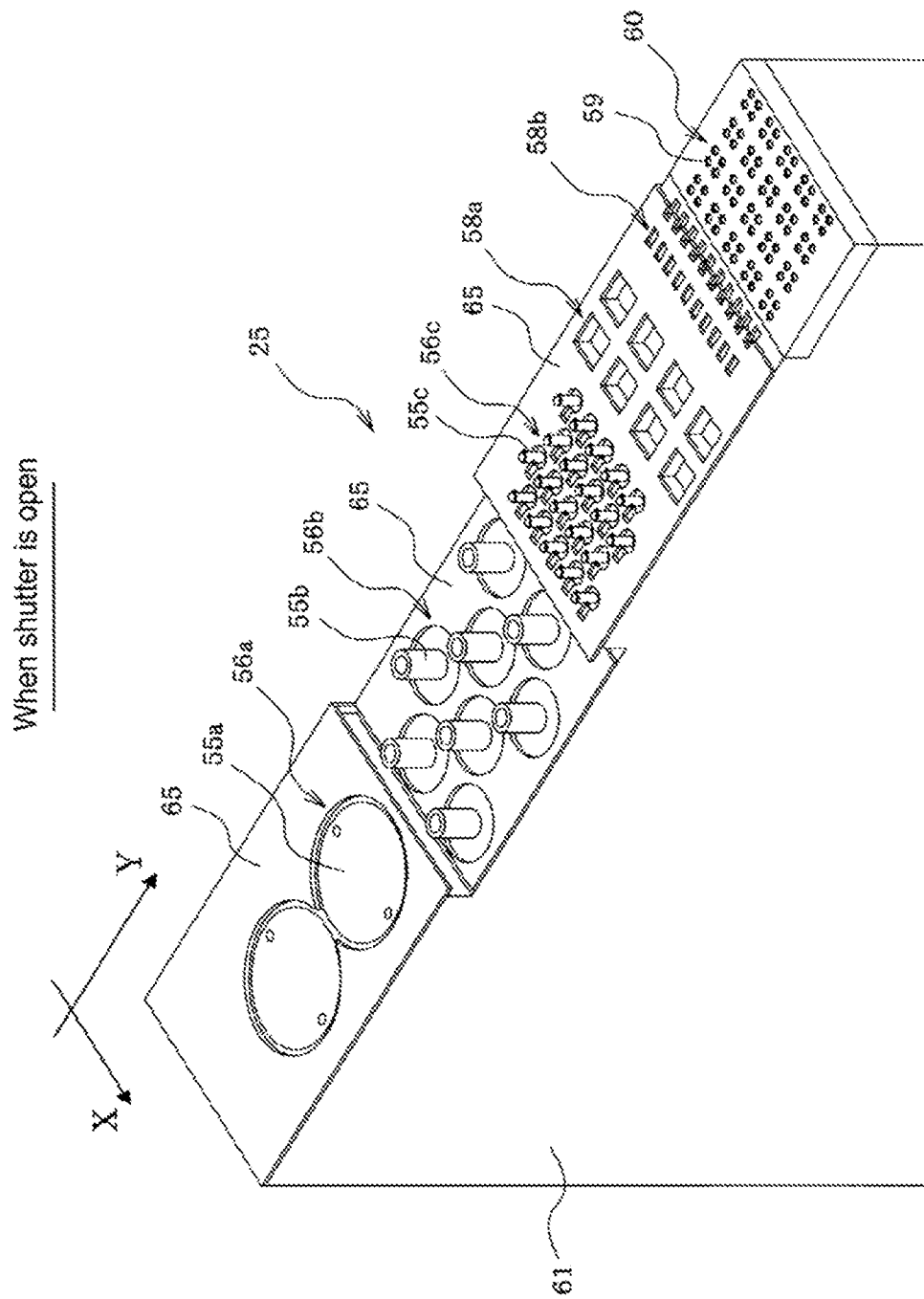
FIG. 5 is a perspective view of an entirety of an upper portion of a component mounting positional deviation amount measurement unit when a shutter is opened.
Figure 6:
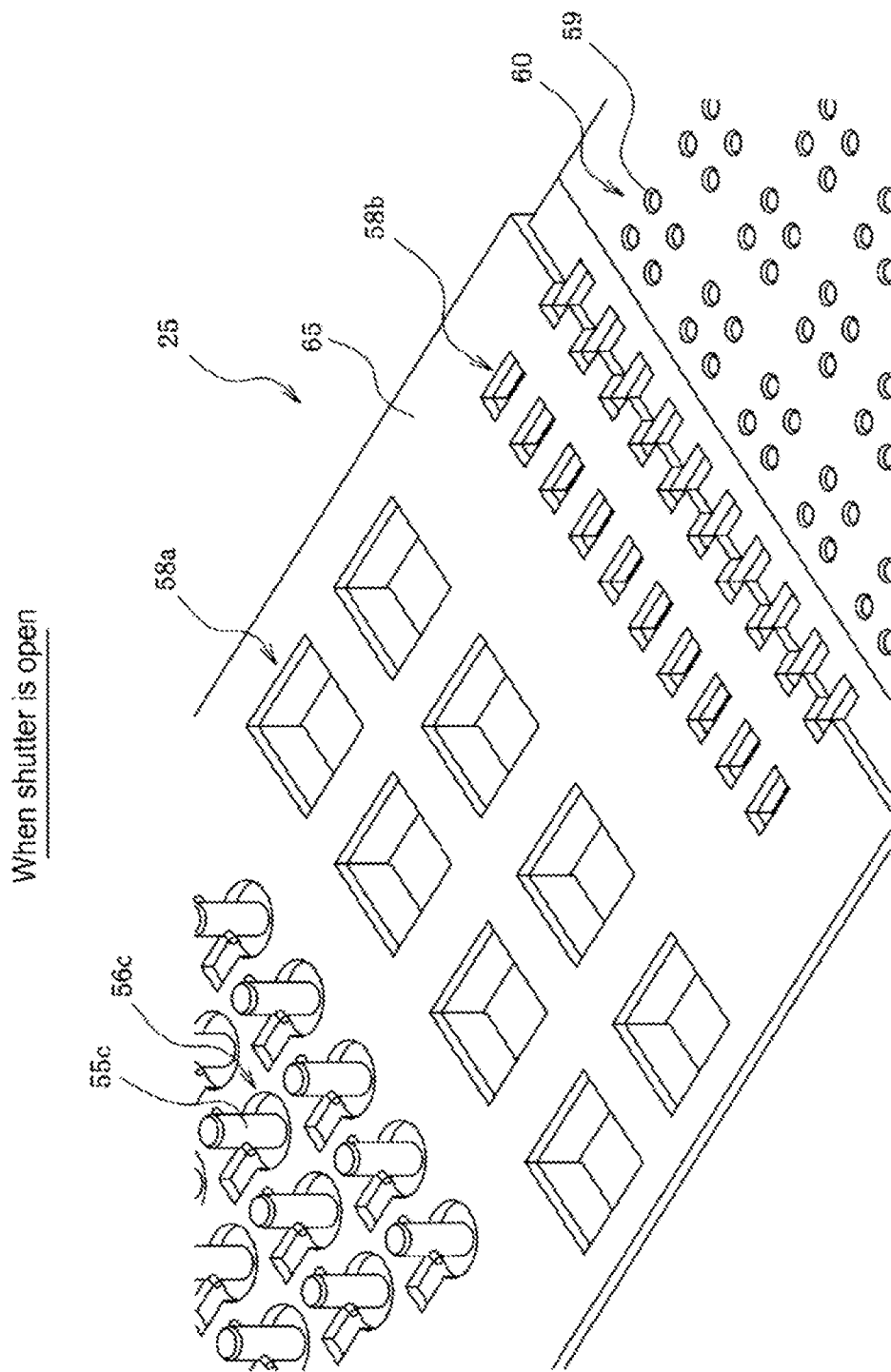
FIG. 6 is a partial enlarged perspective view of the upper portion of the component mounting positional deviation amount measurement unit when the shutter is opened.
Figure 7:
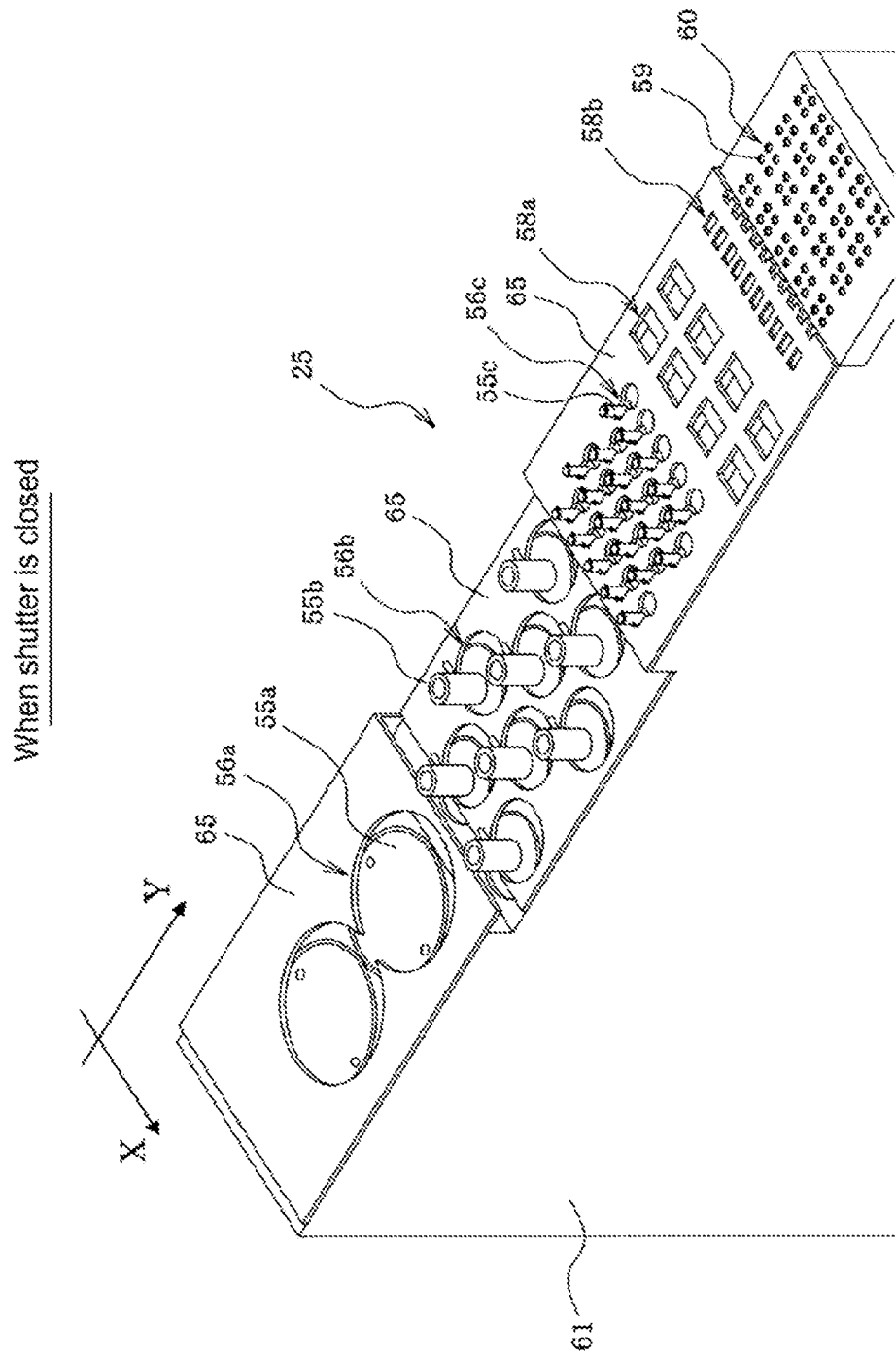
FIG. 7 is a perspective view of the entirety of the upper portion of the component mounting positional deviation amount measurement unit when the shutter is closed.
Figure 8:
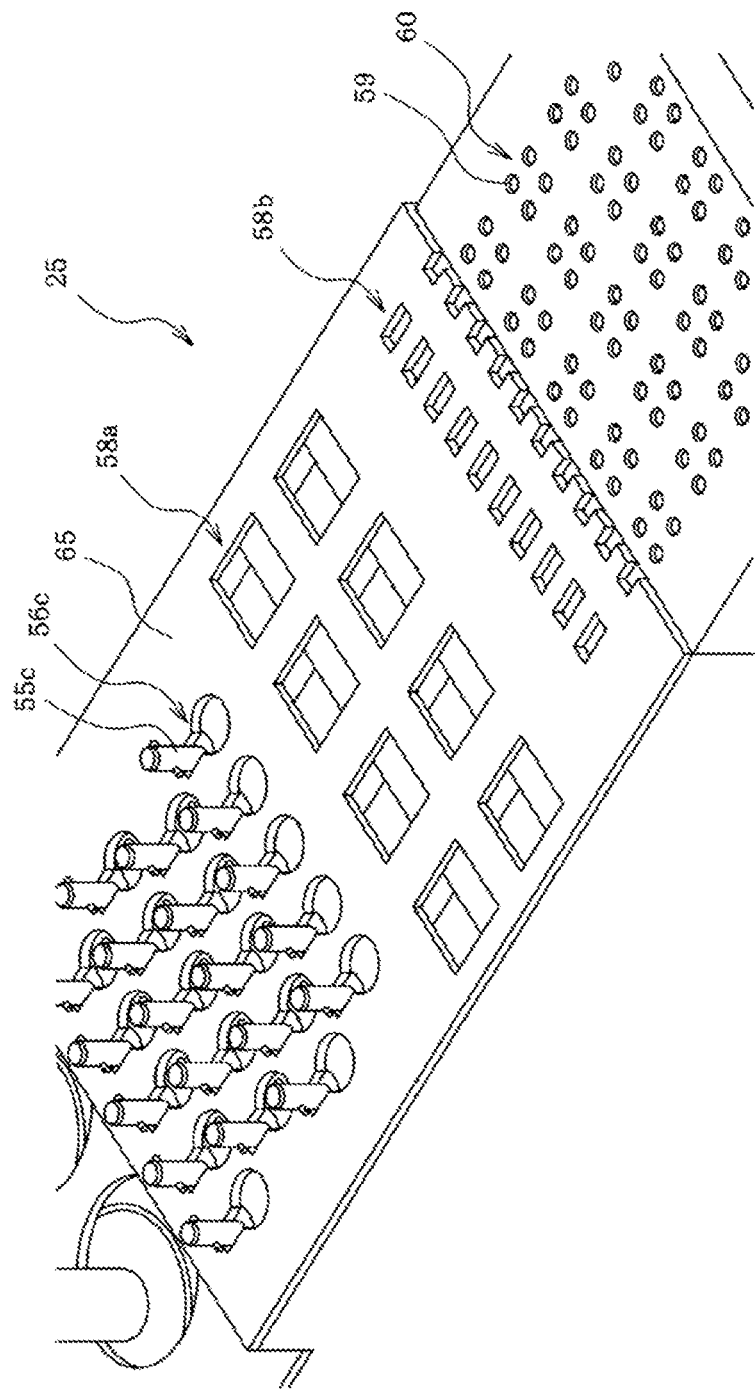
FIG. 8 is a partial enlarged perspective view of the upper portion of the component mounting positional deviation amount measurement unit when the shutter is closed.

Here, a configuration of cassette-type feeder 14 will be described with reference to FIG. 4. Cassette case 32 of cassette-type feeder 14 is formed of a transparent or opaque plastic plate, a metal plate, or the like, and a side face portion (cover) thereof can be opened and closed. Tape loading section 35 in which tape reel 34, around which component supply tape 33 is wound, is loaded in an attachable and detachable manner (an exchangeable manner) is provided in cassette case 32. Reel holding shaft 36 that rotatably holds the tape reel 34 is provided at a center of tape loading section 35.

Tape feeding mechanism 38 that feeds component supply tape 33 drawn out from tape reel 34 to the component pickup position and top film peeling mechanism 39 that peels off top film 40 (also referred to as cover tape) from component supply tape 33 in front of the component suction position to expose a component in component supply tape 33 are provided in cassette case 32.

Tape feeding mechanism 38 is configured of sprocket 42 that is provided in the vicinity of a lower portion of the component pickup position, motor 43 that drives sprocket 42 to rotate, and the like. Teeth of sprocket 42 are engaged with tape feeding holes formed at one side edge of component supply tape 33 at predetermined pitches to rotate sprocket 42. Therefore, component supply tape 33 is pitch-fed to the component pickup position.

Top film peeling mechanism 39 is configured of tape presser 45 that presses component supply tape 33 in front of the component suction position to peel off top film 40 from an upper face of component supply tape 33, top film feed gear mechanism 47 that pulls top film 40 peeled off by tape presser 45 in a direction opposite to a tape feeding direction and feeds top film 40 into top film collection section 46 provided in an upper portion of cassette case 32, motor 48 that drives top film feed gear mechanism 47, and the like.

Waste tape discharge passage 50 that guides and discharges waste tape 33a (in this embodiment, only a carrier tape from which top film 40 has been peeled off), from which a component passing through the component pickup position has been picked up, downward is provided in an end edge portion of cassette case 32 on a tape feeding direction side. Outlet 50a of waste tape discharge passage 50 is provided at a position lower than a center of an end face of cassette case 32 on the tape feeding direction side.

Control device 52 that controls motor 43 of tape feeding mechanism 38 and motor 48 of top film peeling mechanism 39 is provided in cassette case 32. In addition, although not illustrated, a communication and power supply connector connected to a communication power supply connector on a component mounting machine 12 side is provided in cassette case 32.

In addition, a feeder identification information recording section (not illustrated) that records and stores a feeder ID (identification information of feeder 14) is provided at a predetermined position of cassette case 32. As the feeder identification information recording section, for example, a code label in which the feeder ID is recorded by a bar code, a two-dimensional code, or the like may be used, or an electronic tag (also referred to as an RF tag, an IC tag, an electromagnetic wave tag, or a wireless tag) storing data of the feeder ID may be used.

Next, a configuration of component mounting positional deviation amount measurement unit 25 will be described with reference to FIGS. 5 to 10. Component mounting positional deviation amount measurement unit 25 is configured so as to be exchangeably set with cassette-type feeder 14 in feeder setting section 24 of component mounting machine 12. A height dimension and a depth dimension (dimension in the Y-direction) of component mounting positional deviation amount measurement unit 25 are substantially the same as a height dimension and a depth dimension of cassette-type feeder 14. An attaching structure of component mounting positional deviation amount measurement unit 25 to feeder setting section 24 of component mounting machine 12 is common to an attaching structure of cassette-type feeder 14. A width dimension (dimension the X-direction) of component mounting positional deviation amount measurement unit 25 is not necessarily the same as a width dimension of cassette-type feeder 14, and may be a width dimension that straddles multiple slots of feeder setting section 24, so long as the width dimension allows setting to feeder setting section 24.

Component mounting positional deviation amount measurement unit 25 is configured from measurement nozzle placement sections 56a to 56c that allow placing of measurement nozzles 55a to 55c which are exchangeably held in mounting head 15 of component mounting machine 12, measurement component placement sections 58a and 58b that allow placing of a measurement component (measurement component 57 made of glass in FIGS. 9 and 10), and measurement mounting table 60 in which measurement fiducial mark 59 is provided, at an upper face portion of unit case 61.

Component mounting machine 12 of the embodiment is configured to exchangeably hold multiple types (for example, three types) of the suction nozzles in mounting head 15. Correspondingly, component mounting positional deviation amount measurement unit 25 is provided with multiple types (for example, three types) of the measurement nozzle placement sections, 56a to 56c, to allow placing of multiple types (for example, three types of a large size, a medium size, and a small size) of measurement nozzles 55a to 55c. In addition, multiple types (for example, two types) of measurement component placement sections, 58a and 58b, are provided corresponding to the multiple types of measurement nozzles 55a to 55c and multiple types (for example, two types) of the measurement components are placed by the multiple types of the measurement nozzles 55a to 55c to be capable of being picked up. For example, measurement component 57 (see FIGS. 9 and 10) made of glass for being picked up by the measurement nozzles 55a and 55b of the large size and the medium size is placed in one measurement component placement section, 58a. The measurement component (square chip) of the small size for being picked up by the measurement nozzle 55c of the small size is placed in the other measurement component placement section, 58b.

Meanwhile, mounting head 15 of component mounting machine 12 is a mounting head that holds only one suction nozzle but may be a mounting head that holds multiple suction nozzles. In the latter case, it is necessary to exchange all the multiple suction nozzles held in mounting head 15 with one of the measurement nozzles 55a to 55c and to measure the component mounting positional deviation amount for each nozzle.

Considering this point, component mounting positional deviation amount measurement unit 25 of the embodiment is configured so that each of the measurement nozzle placement sections 56a to 56c allows placing of the measurement nozzles 55a to 55c of at least the number thereof which can be held in mounting head 15, is configured so that each of the measurement component placement sections 58a and 58b allows placing of the measurement components 57 of at least the number same as the number of the measurement nozzles 55a to 55c which can be held in mounting head 15, or the like, and is configured so that measurement mounting table 60 allows mounting of the measurement components 57 of at least the number same as the number (greatest number of the number of each of the measurement nozzles 55a to 55c) of the nozzles which can be held in mounting head 15.

In the embodiment, measurement nozzle placement section 56a that allows placing of measurement nozzle 55a of the large size is formed so that two measurement nozzles 55a of the large size can be placed, measurement nozzle placement section 56b that allows placing of measurement nozzle 55b of the medium size is formed so that eight measurement nozzles 55b of the medium size can be placed, and the measurement nozzle placement section 56c that allows placing of measurement nozzle 55c of the small size is formed so that twenty measurement nozzles 55c of the small size can be placed.

Figure 9:
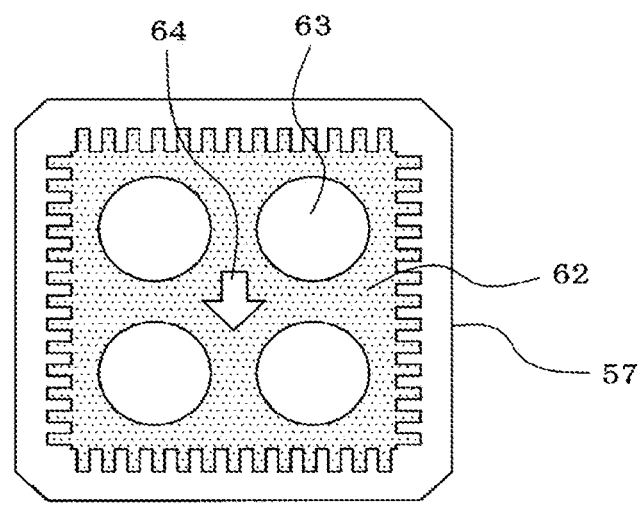
FIG. 9 is a top view of a measurement component made of glass.
Figure 10:
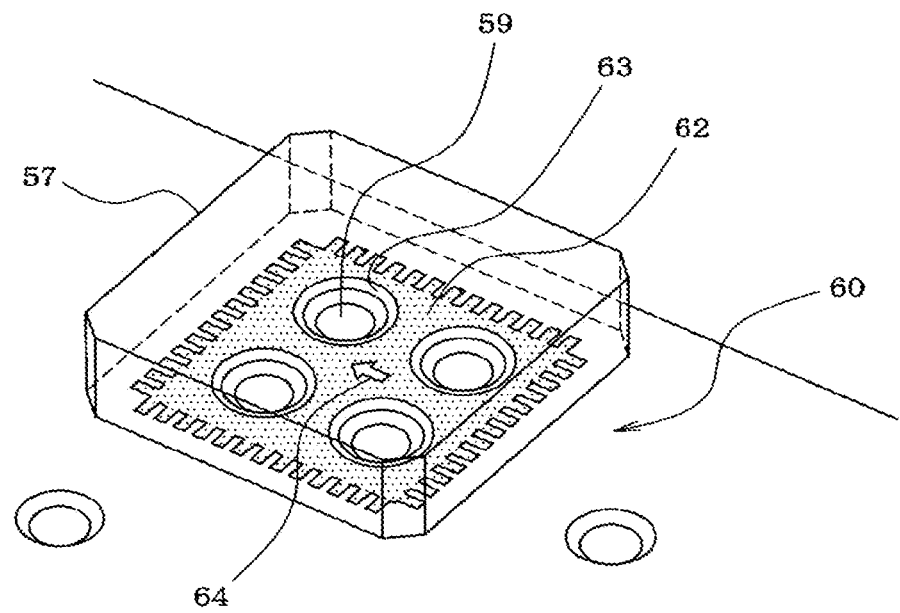
FIG. 10 is a perspective view illustrating a state where the measurement component made of glass is mounted on a measurement mounting table.

Measurement nozzles 55a and 55b of the large size and the medium size pick up measurement component 57 made of glass illustrated in FIGS. 9 and 10. Measurement component placement section 58a that allows placing of the measurement component 57 made of glass is formed to allow placing of eight measurement components 57 made of glass, which is the same as the larger number of the numbers of the measurement nozzles 55a and 55b of the large size and the medium size. Measurement component placement section 58b that allows placing of the measurement component (square chip) of the small size is formed to allow placing of twenty measurement components (square chips) of the small size, which is the same as the number of measurement nozzles 55c of the small size.

In addition, the measurement mounting table 60 is formed to allowing mounting of twenty measurement components (square chips) of the small size, which is the same as the number of the nozzles (greatest number of the number of each of the measurement nozzles 55a to 55c) which can be held in mounting head 15. Measurement fiducial marks 59 of a predetermined number (for example, four) thereof are formed in each component mounting area of measurement mounting table 60 in a fixed positional relationship.

As illustrated in FIGS. 9 and 10, an opaque graphic pattern 62 imitating an external shape of an IC chip with a lead is formed in the lower face of measurement component 57 made of glass, transparent window section 63 that is slightly larger than measurement fiducial mark 59 is formed at a position corresponding to measurement fiducial mark 59 of measurement mounting table 60 in graphic pattern 62. When measurement component 57 made of glass is mounted on the component mounting area of measurement mounting table 60, window section 63 of graphic pattern 62 of measurement component 57 is in a state of overlapping with measurement fiducial mark 59 and is imaged by mark imaging camera 18 from above, and an image thereof is processed. Therefore, a deviation amount (positional deviation amount of graphic pattern 62 of measurement component 57 with respect to measurement fiducial mark 59) of the mounting position of measurement component 57 with respect to measurement fiducial mark 59 is measured as a component mounting positional deviation amount of component mounting machine 12. In addition, arrow mark 64 indicating a direction of measurement component 57 is formed in graphic pattern 62 of measurement component 57.

Meanwhile, there is a possibility that measurement component 57 or the like is shifted on measurement mounting table 60 only by mounting (placing) the measurement component 57 made of glass and the measurement component (square chip) of the small size on measurement mounting table 60.

As a countermeasure against this, in the example, a holding device (not illustrated) that holds measurement component 57 or the like mounted (placed) on measurement mounting table 60 is provided. Here, as the holding device, an electrostatic chuck, a vacuum chuck, or the like may be used.

In addition, in order to prevent measurement nozzles 55a to 55c on measurement nozzle placement sections 56a to 56c, measurement components 57 on measurement component placement sections 58a and 58b, and the like from dropping off when component mounting positional deviation amount measurement unit 25 is attached and detached, and moved, shutter plate 65 is provided on the upper face of component mounting positional deviation amount measurement unit 25 so as to be capable of opening and closing slidably. A motor (not illustrated) is provided inside component mounting positional deviation amount measurement unit 25 as a driving source that drives opening and closing of shutter plate 65. Moreover, as the driving source, a cylinder, a solenoid, or the like may be used. When the component mounting positional deviation amount is measured, the driving source of the shutter mechanism is energized and shutter plate 65 is held by the driving force of the driving source in a state of being slid to an open position illustrated in FIGS. 5 and 6, and the measurement of the component mounting positional deviation amount is completed. Thereafter, the energization of the driving source of the shutter mechanism is turned off, shutter plate 65 is automatically held in a state of being slid to a closed position illustrated in FIGS. 7 and 8 by a return spring (not illustrated) of the shutter mechanism, and measurement nozzles 55*a* to 55*c*, measurement component 57, and the like are prevented from jumping out.

Furthermore, component mounting positional deviation amount measurement unit 25 is provided with a connector (not illustrated) for supplying an operation power supply from the component mounting machine 12 side to the driving source of the shutter mechanism and receiving a signal for controlling an opening and closing operation of the shutter mechanism. Component mounting positional deviation amount measurement unit 25 is set to feeder setting section 24 of component mounting machine 12 so that the connector on the component mounting positional deviation amount measurement unit 25 side is connected to the connector on the component mounting machine 12 side. Therefore, component mounting positional deviation amount measurement unit 25 is set to feeder setting section 24 of component mounting machine 12 so that the connector on the component mounting positional deviation amount measurement unit 25 side can simultaneously connect to the connector on the component mounting machine 12 side, and it is unnecessary to perform connection work of the connectors after component mounting positional deviation amount measurement unit 25 is set.

In addition, a unit identification information recording section (not illustrated) in which a unit ID (identification information of component mounting positional deviation amount measurement unit 25) is recorded or stored is provided at a predetermined position of component mounting positional deviation amount measurement unit 25. A type of the component mounting positional deviation amount measurement unit 25, types and the number of the placed measurement nozzles 55*a* to 55*c*, a type and the number of the placed measurement components 57, the number of components capable of being mounted on the measurement mounting table 60, or the like can be identified by the unit ID. As the unit identification information recording section, for example, a code label in which a feeder ID is recorded by a bar code, a two-dimensional code, or the like may be used, or an electronic tag (also referred to as an RF tag, an IC tag, an electromagnetic wave tag, a wireless tag, or the like) storing data of the feeder ID may be used.

Next, a configuration of automatic exchanging system 26 that automatically exchanges cassette-type feeder 14 and component mounting positional deviation amount measurement unit 25 which are set in feeder setting section 24 of each of the component mounting machines 12 will be described.

Automatic exchanging system 26 is configured to include stock section 71 that stores multiple cassette-type feeders 14 and at least one component mounting positional deviation amount measurement unit 25 which are set in feeder setting section 24 of component mounting machine 12, exchanging robot 72 that exchanges cassette-type feeder 14 and component mounting positional deviation amount measurement unit 25 between feeder setting section 24 and stock section 71, an identification information reading section 73 (see FIG. 3) that reads the feeder ID and the unit ID from the feeder identification information recording section of cassette-type feeder 14 and the unit identification information recording section of component mounting positional deviation amount measurement unit 25.

In the embodiment, stock section 71 is disposed below feeder setting section 24 of the multiple component mounting machines 12 and is configured to store multiple cassette-type feeders 14 and at least one component mounting positional deviation amount measurement unit 25 in feeder setting section 24 of the multiple component mounting machines 12. Exchanging robot 72 picks up cassette-type feeder 14 of the exchanging target from feeder setting section 24 of multiple component mounting machines 12, stores the cassette-type feeder 14 in stock section 71, picks up the cassette-type feeder 14 designated in the production job from stock section 71, and sets the cassette-type feeder 14 in feeder setting section 24 of the multiple component mounting machines 12. Furthermore, in a case where the component mounting positional deviation amount of any one of the component mounting machines 12 in the multiple component mounting machines 12 is measured, exchanging robot 72 picks up component mounting positional deviation amount measurement unit 25 from the stock section 71, sets component mounting positional deviation amount measurement unit 25 in an empty slot of feeder setting section 24 of component mounting machine 12, measures the component mounting positional deviation amount of component mounting machine 12, and then picks up component mounting positional deviation amount measurement unit 25 from feeder setting section 24 of component mounting machine 12, and stores the component mounting positional deviation amount measurement unit 25 in stock section 71.

In addition, in a case where the component mounting positional deviation amount of the multiple component mounting machines 12 is sequentially measured, first, exchanging robot 72 repeats an operation of picking up component mounting positional deviation amount measurement unit 25 from feeder setting section 24 of component mounting machine 12, on which the measurement of the component mounting positional deviation amount is completed, setting component mounting positional deviation amount measurement unit 25 in feeder setting section 24 of component mounting machine 12 next in the measurement order, and measuring the component mounting positional deviation amount of the component mounting machine 12 next in the measurement order, so as to sequentially measure the component mounting positional deviation amount of the multiple component mounting machines 12.

Figure 1:
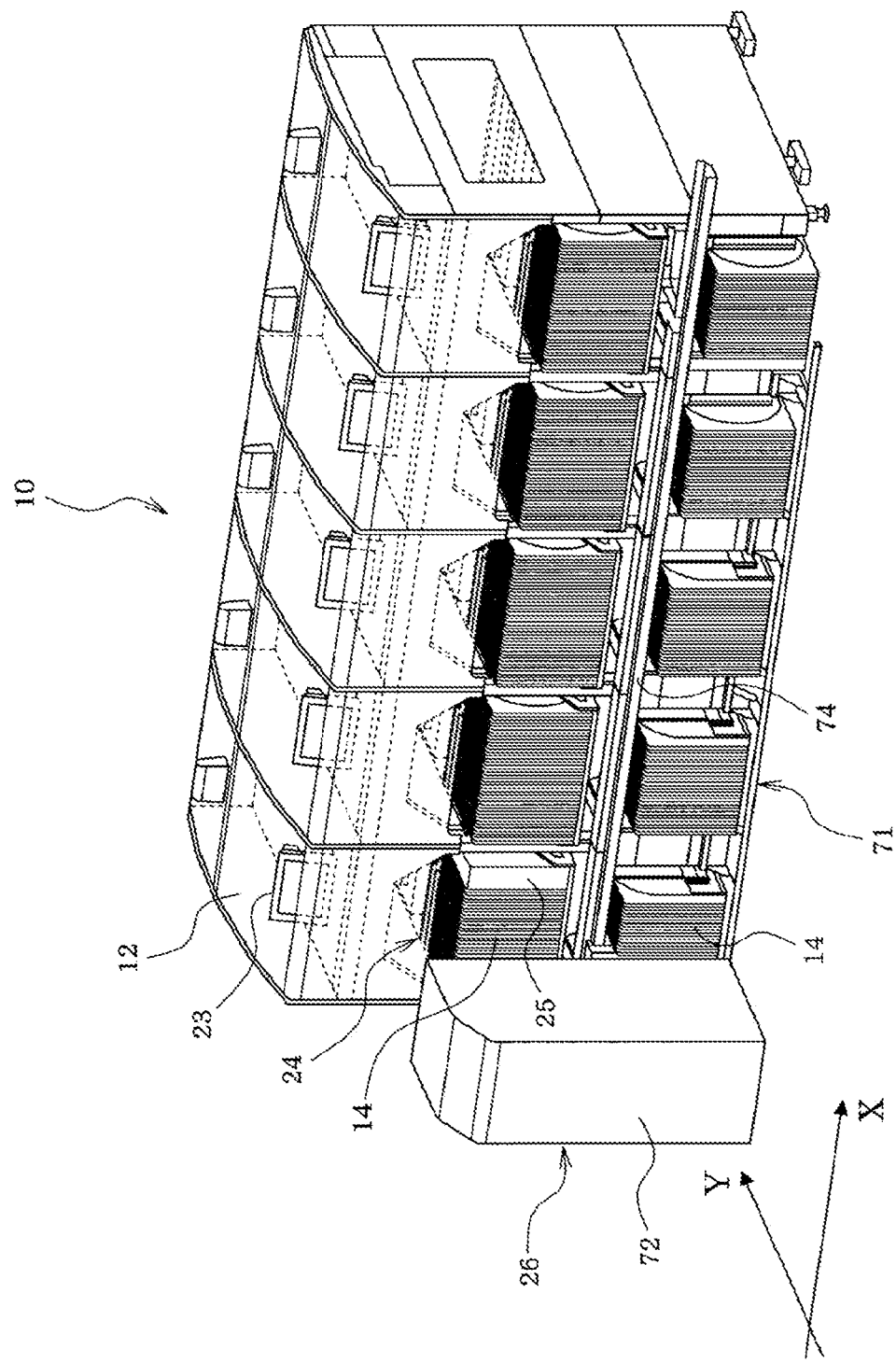
FIG. 1 is a perspective view illustrating a configuration of an entirety of a component mounting line of an embodiment of the disclosure.

A front area of feeder setting section 24 of the multiple component mounting machines 12 and stock section 71 is used as a switching area for switching cassette-type feeder 14 and component mounting positional deviation amount measurement unit 25 between feeder setting section 24 and stock section 71, and exchanging robot 72 is disposed in the switching area. As illustrated in FIG. 1, an X-axis rail 74 for moving exchanging robot 72 in the left-right direction (X-direction) along the arrangement of component mounting machines 12 is provided on the front face of component mounting line 10 so as to extend in the X-direction.

As illustrated in FIG. 3, control device 75 of automatic exchanging system 26 is connected to production management computer 70 of component mounting line 10 by a network, controls an operation of exchanging robot 72 according to production management information such as board type switching information and component shortage information, and a component mounting positional deviation amount measuring instruction transmitted from production management computer 70 of component mounting line 10. Control device 75 switches cassette-type feeder 14 and component mounting positional deviation amount measurement unit 25 between feeder setting section 24 of each component mounting machine 12 and stock section 71.

In a case where the component mounting positional deviation amount of any one component mounting machine 12 of the multiple component mounting machines 12 of component mounting line 10 is measured, exchanging robot 72 picks up component mounting positional deviation amount measurement unit 25 from stock section 71, sets component mounting positional deviation amount measurement unit 25 in an empty slot of feeder setting section 24 of component mounting machine 12, causes all the nozzle holders of mounting head 15 of component mounting machine 12 to hold one of the measurement nozzles 55a to 55c, picks up measurement component 57 or the measurement component (square chip) of the small size using each measurement nozzle, images the components by component imaging camera 17 of component mounting machine 12 from the lower face side thereof, processes captured images thereof, and measures the deviation amount of the pickup position of the measurement component with respect to each measurement nozzle in the XY-directions and a θ direction (rotational direction). Thereafter, exchanging robot 72 corrects the deviation amount of the pickup position in the XY-directions and the θ direction, mounts all the measurement components on measurement mounting table 60, captures and images the measurement components and measurement fiducial mark 59 in the visual field of mark imaging camera 18, and measures the deviation amount of the mounting position of the measurement component with respect to measurement fiducial mark 59 in the XY-directions and the θ direction.

Figure 11:
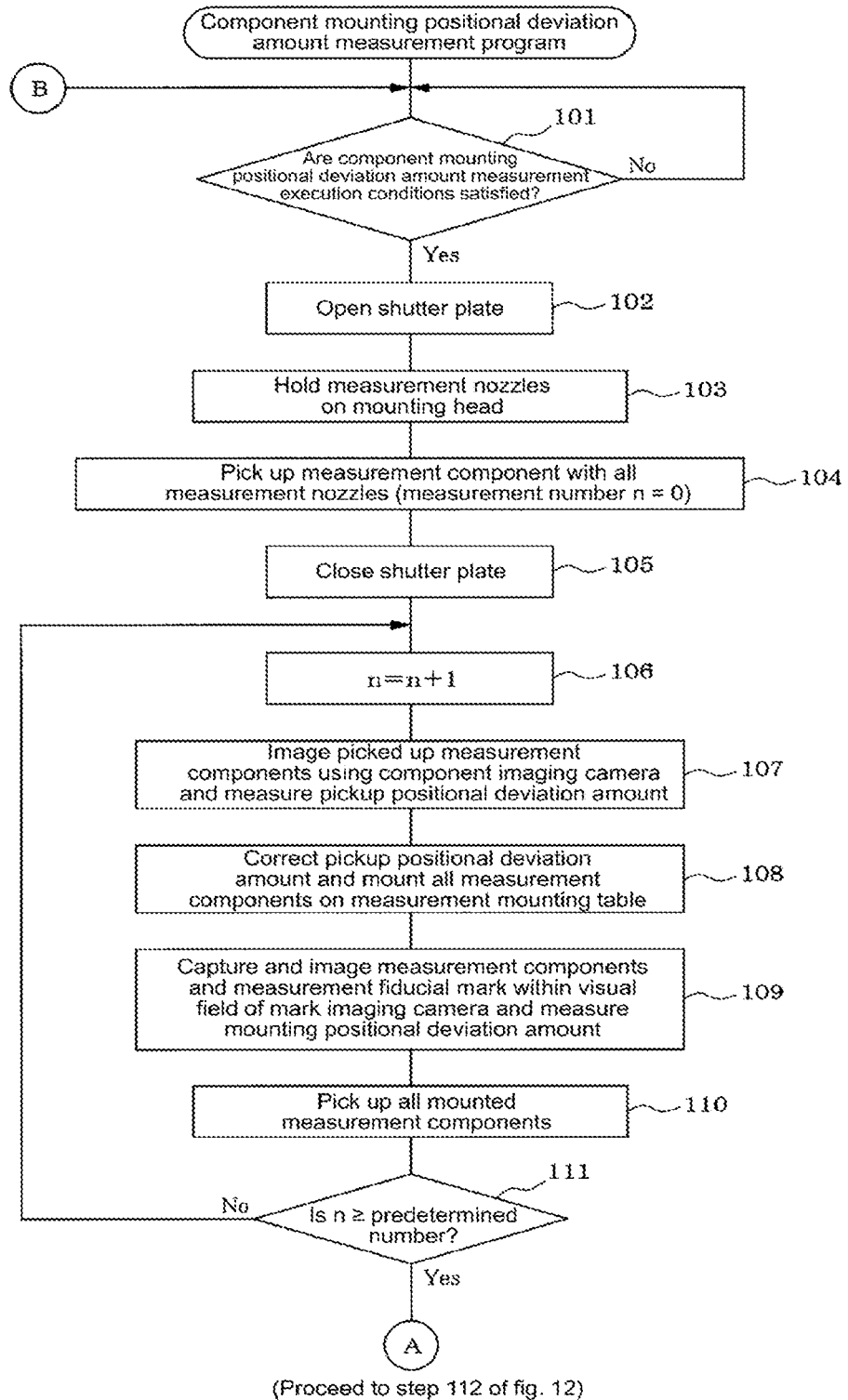
FIG. 11 is a flowchart (No. 1) illustrating a flow of a process of a component mounting positional deviation amount measurement program.
Figure 12:
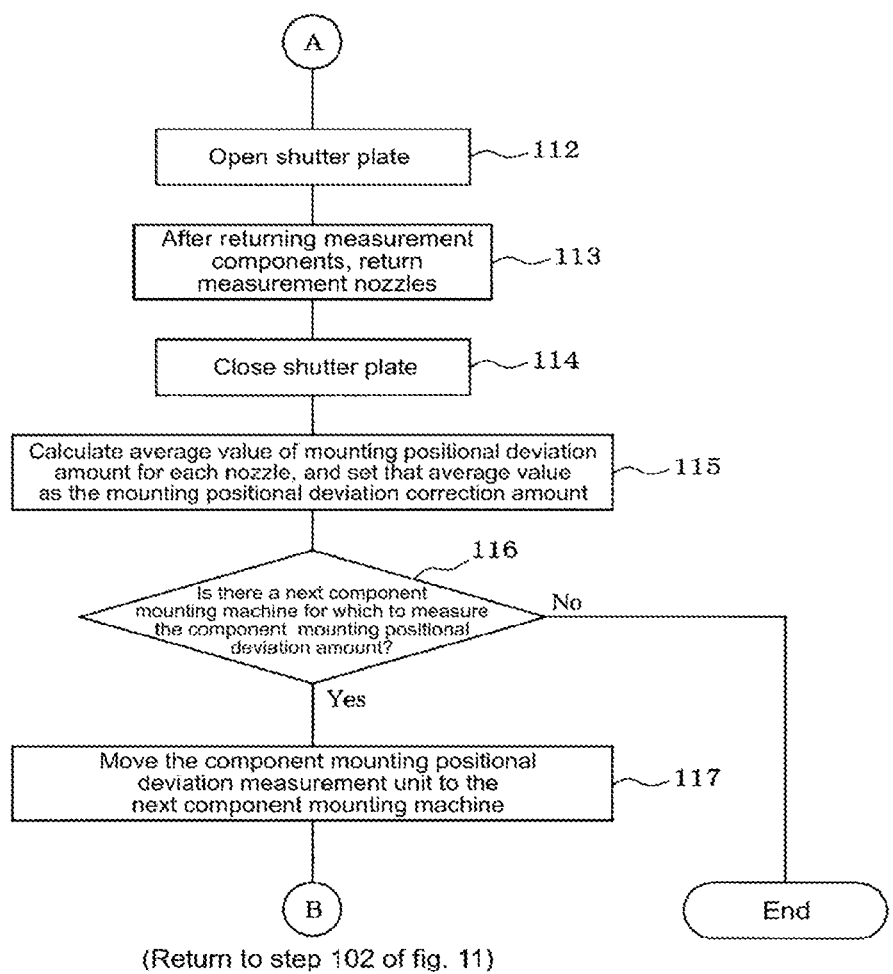
FIG. 12 is a flowchart (No. 2) illustrating a flow of a process of the component mounting positional deviation amount measurement program.

The measurement of the component mounting positional deviation amount of each of the component mounting machines 12 of the embodiment described above is executed according to a component mounting positional deviation amount measurement program of FIGS. 11 and 12. A process of each of steps 101 to 117 of the program is executed by one of the control devices 20 of each of the component mounting machines 12, control device 75 of automatic exchanging system 26, or production management computer 70.

When the program is started, first, in step 101, it is determined whether component mounting positional deviation amount measurement execution conditions are satisfied. Here, the component mounting positional deviation amount measurement execution conditions are, for example, (1) an instruction to measure the component mounting positional deviation amount has been issued, (2) exchanging robot 72 has completed the operation of picking up component mounting positional deviation amount measurement unit 25 from stock section 71 and setting component mounting positional deviation amount measurement unit 25 in feeder setting section 24 of component mounting machine 12, (3) production is not currently being performed (for example, before the start of production), and the like. If there is a condition that does not satisfy any one of the conditions (1) to (3) and the like, the component mounting positional deviation amount measurement execution conditions are not established and processing stands by in step 101.

On the other hand, if all the conditions (1) to (3) are satisfied, the component mounting positional deviation amount measurement execution conditions are established and the process proceeds to step 102, the driving source of the shutter mechanism of component mounting positional deviation amount measurement unit 25 is energized, shutter plate 65 is opened by a driving force of the driving source thereof, measurement nozzles 55a to 55c on measurement nozzle placement sections 56a to 56c, measurement components 57 on measurement component placement sections 58a and 58b, and the like are in a state of being able to be picked up.

Thereafter, the process proceeds to step 103, the measurement nozzles that are held in all the nozzle holders of mounting head 15 of component mounting machine 12 are selected from the measurement nozzles 55a to 55c on the measurement nozzle placement sections 56a to 56c, and the measurement nozzles are held by all the nozzle holders of mounting head 15. Thereafter, the process proceeds to step 104 and the measurement components 57 made of glass or the measurement components (square chips) of the small size are picked up by all the measurement nozzles held in mounting head 15. In addition, a count value n of a measurement number counter that counts the number of times of the component mounting positional deviation amount is reset (n=0).

In the next step 105, energization of the driving source of the shutter mechanism of component mounting positional deviation amount measurement unit 25 is turned off to close shutter plate 65, the process proceeds to step 106, and the count value n of the measurement number counter is set to increment (n=n+1).

Thereafter, the process proceeds to step 107, the measurement component picked up by each measurement nozzle is imaged by component imaging camera 17 of component mounting machine 12 from the lower face side, the captured image is processed, the deviation amount of the pickup position of the measurement component with respect to each measurement nozzle in the XY-directions and the θ direction is measured. Thereafter, the process proceeds to step 108, the measured deviation amount of the pickup position in the XY-directions and the θ direction is corrected, and the measurement components picked up by all the measurement nozzles are sequentially mounted on measurement mounting table 60.

Thereafter, the process proceeds to step 109, the measurement component and measurement fiducial mark 59 are captured and imaged in the visual field of mark imaging camera 18, the captured image is processed, and the deviation amount (component mounting positional deviation amount) of the mounting position of the measurement component with respect to measurement fiducial mark 59 in the XY-directions and the θ direction is measured. The measurement is sequentially performed for all the measurement components mounted on measurement mounting table 60. Thereafter, the process proceeds to step 110, and all the measurement components mounted on measurement mounting table 60 are picked up by the measurement nozzles respectively.

In the next step 111, it is determined whether the number of times of measurement n counted by the measurement number counter has reached a predetermined number of times; if the number of times of measurement n has not reached the predetermined number of times, the processes of steps 106 to 111 are repeated, such that the operation of measuring the deviation amount of the mounting position of the measurement component is repeated.

Therefore, when the number of times of measurement n of the deviation amount of the mounting position of the measurement component reaches the predetermined number of times, the measurement of the deviation amount of the mounting position of the measurement component is completed, the process proceeds to step 112 of FIG. 12, the driving source of the shutter mechanism of component mounting positional deviation amount measurement unit 25 is energized, and shutter plate 65 is opened by the driving force of the driving source. Thereafter, the process proceeds to step 113, the measurement component picked up by the measurement nozzle is returned to the measurement component placement sections 58a and 58b, and then the measurement nozzle held in mounting head 15 is returned to measurement nozzle placement sections 56a to 56c.

Thereafter, the process proceeds to step 114, the energization of the driving source of the shutter mechanism of component mounting positional deviation amount measurement unit 25 is turned off to close shutter plate 65. Thereafter, the process proceeds to step 115, an average value of the deviation amounts of the mounting positions of the measurement components which are measured by the predetermined number of times is calculated for each nozzle and the average value is set as the mounting positional deviation correction amount of the component mounting operation. Therefore, the mounting positional deviation correction amount can be accurately set and the component mounting accuracy can be improved.

Thereafter, the process proceeds to step 116, it is determined whether there is a next component mounting machine 12 (hereinafter, referred to as "next component mounting machine 12") for which the component mounting positional deviation amount is to be measured; if there is a next component mounting machine 12, the process proceeds to step 117, component mounting positional deviation amount measurement unit 25 is picked up by exchanging robot 72 from feeder setting section 24 of the measured component mounting machine 12, component mounting positional deviation amount measurement unit 25 is set in feeder setting section 24 of the next component mounting machine 12, the processes of steps 101 to 115 are executed, and the component mounting positional deviation amount of the next component mounting machine 12 is measured. Thereafter, in step 116, when it is determined that there is no next component mounting machine 12, the program is completed.

In the example described above, component mounting positional deviation amount measurement unit 25 is set in feeder setting section 24 of component mounting machine 12 so as to be exchangeable with cassette-type feeder 14. Therefore, it is possible to reuse one component mounting positional deviation amount measurement unit 25 with respect to the multiple component mounting machines 12, it is unnecessary to provide component mounting positional deviation amount measurement unit 25 for each component mounting machine 12, and it is possible to reduce a manufacturing cost of component mounting machine 12. In addition, component mounting positional deviation amount measurement unit 25 of the embodiment may have a size capable of being set in feeder setting section 24 of component mounting machine 12. Therefore, component mounting positional deviation amount measurement unit 25 can be made larger than the related art (PTL 1) and it is also easy to add a new function such as measurement nozzle placement sections 56a to 56c in which measurement nozzles 55a to 55c are placed, or the like. Furthermore, component mounting positional deviation amount measurement unit 25 of the embodiment includes the measurement nozzle placement sections 56a to 56c. Therefore, it is unnecessary for an operator to set measurement nozzles 55a to 55c in the nozzle station for each component mounting machine 12 and workability can be improved.

Furthermore, the attaching structure of component mounting positional deviation amount measurement unit 25 to feeder setting section 24 is common to an attaching structure of cassette-type feeder 14. Therefore, it is possible to perform attachment and detachment of component mounting positional deviation amount measurement unit 25 in the same procedure as attachment and detachment of cassette-type feeder 14 and the attachment and detachment of component mounting positional deviation amount measurement unit 25 is easy.

Furthermore, in component mounting positional deviation amount measurement unit 25 of the embodiment, measurement nozzle placement sections 56a to 56c are configured to allow placing of measurement nozzles 55a to 55c of at least the number thereof which can be held in mounting head 15. The measurement component placement sections 58a and 58b are configured to allow placing of measurement components 57 of at least the same number as the number of measurement nozzles 55a to 55c which can be held in mounting head 15. The measurement mounting table 60 is configured to allow mounting of measurement components 57 of at least the same number as the number of measurement nozzles 55a to 55c which can be held in mounting head 15. Therefore, even in a case where multiple suction nozzles are held in mounting head 15, the nozzle exchanging operation of measurement nozzles 55a to 55c, the pickup, the mounting operation, and the imaging operation of measurement component 57 can be performed collectively for each number of nozzles that can be held in mounting head 15. The measurement of the component mounting positional deviation amount corresponding to the number of nozzles can be efficiently performed.

In addition, in a case where the number of measurement nozzles 55a to 55c is smaller than the number of the nozzles that can be held in mounting head 15, the measurement of the component mounting positional deviation amount corresponding to the number of measurement nozzles 55a to 55c may be performed, then the positions of measurement nozzles 55a to 55c may be changed, and then the measurement of remaining component mounting positional deviation amounts may be performed.

In addition, in component mounting positional deviation amount measurement unit 25 of the embodiment, measurement nozzle placement sections 56a to 56c are configured to allow placing of multiple measurement nozzles 55a to 55c. Measurement component placement sections 58a and 58b are configured to allow placing of multiple types of measurement components 57 and the like which can be picked up by multiple measurement nozzles 55a to 55c. Therefore, also for component mounting machine 12 in which the multiple types of the suction nozzles are exchangeably held in mounting head 15, the component mounting positional deviation amount of the multiple types of the nozzles can be measured for each nozzle type without changing component mounting positional deviation amount measurement unit 25 for each nozzle type.

In addition, in the example, shutter plate 65 that prevents measurement nozzles 55a to 55c on measurement nozzle placement sections 56a to 56c and measurement components 57 and the like on measurement component placement sections 58a and 58b from dropping off when component mounting positional deviation amount measurement unit 25 is attached and detached, and moved is provided. Therefore, it is possible to further reliably prevent measurement nozzles 55a to 55c, measurement component 57, and the like from dropping off by shutter plate 65 when component mounting positional deviation amount measurement unit 25 is attached and detached, and moved.

In addition, in the embodiment, component mounting positional deviation amount measurement unit 25 is automatically exchanged using automatic exchanging system 26 that automatically exchanges the cassette-type feeder 14. Therefore, component mounting positional deviation amount measurement unit 25 and cassette-type feeder 14 can be automatically exchanged during the operation of component mounting machine 12, it is unnecessary for an operator to perform the exchange work of component mounting positional deviation amount measurement unit 25 and cassette-type feeder 14, and it is possible to save labor.

However, with the present disclosure, an operator may perform the exchange work of component mounting positional deviation amount measurement unit 25 and feeder 14. Even in the case, an intended purpose of the disclosure can be achieved. In a case where the operator performs the exchange work, feeder 14 is not limited to the cassette-type feeder and a general tape feeder that is not a cassette-type feeder may be used.

In addition, automatic exchanging system 26 of the embodiment is configured to provide exchanging robot 72 and stock section 71 that are commonly used in the multiple component mounting machines 12 configuring component mounting line 10. Therefore, the exchange work of component mounting positional deviation amount measurement unit 25 and cassette-type feeder 14 with respect to the multiple component mounting machines 12 configuring component mounting line 10 can be handled by one exchanging robot 72, the configuration of component mounting line 10 is simplified, and it is possible to reduce equipment costs.

However, the disclosure may be configured to provide the exchanging robot and the stock section in each of the multiple component mounting machines 12 configuring component mounting line 10. In this case too, an intended purpose of the disclosure can be achieved.

Besides, the present disclosure is not limited to the above-described example, and it is needless to say that various changes and modifications can be made without departing from the gist of the disclosure, such as the configuration of component mounting machine 12 and the configuration of automatic exchanging system 26 may be changed as appropriate.

REFERENCE SIGNS LIST

10 . . . component mounting line, 11 . . . circuit board, 12 . . . component mounting machine, 14 . . . cassette-type feeder, 15 . . . mounting head, 16 . . . head moving device, 17 . . . component imaging camera, 18 . . . mark imaging camera, 20 . . . control device of component mounting machine, 25 . . . component mounting positional deviation amount measurement unit, 26 . . . automatic exchanging system, 32 . . . cassette case, 33 . . . component supply tape, 55a to 55c . . . measurement nozzle, 56a to 56c . . . measurement nozzle placement section, 57 . . . measurement component made of glass, 58a and 58b . . . measurement component placement section, 59 . . . measurement fiducial mark, 60 . . . measurement mounting table, 61 . . . unit case, 62 . . . graphic pattern, 65 . . . shutter plate, 70 . . . production management computer, 71 . . . stock section, 72 . . . exchanging robot, 73 . . . identification information reading section

The invention claimed is:

1. A component mounting positional deviation amount measurement unit comprising:
   a measurement nozzle placement section in which a measurement nozzle exchangeably held in a mounting head of a component mounting machine is placed;
   a measurement component placement section in which a measurement component is placed;
   a measurement mounting table on which a measurement fiducial mark is provided; and
   a shutter mechanism provided on an upper face of the component mounting positional deviation amount measurement unit and being slidable between an open position and a closed position, and when the shutter mechanism is in the closed position, the shutter mechanism is configured to prevent the measurement nozzle on the measurement nozzle placement section and the measurement component on the measurement component placement section from dropping off when the component mounting positional deviation amount measurement unit is attached and detached, and moved,
   wherein when a component mounting positional deviation amount of the component mounting machine is measured, the component mounting positional deviation amount measurement unit is configured to pick up the measurement component by the measurement nozzle by holding the measurement nozzle in the mounting head with the shutter mechanism in the open position, mount the measurement component on the measurement mounting table with the shutter mechanism in the open position, and measure a deviation amount of a mounting position of the measurement component with respect to the measurement fiducial mark as a component mounting positional deviation amount of the component mounting machine with the shutter mechanism in the closed position, and
   wherein the component mounting positional deviation amount measurement unit is configured to be set in a feeder setting section of the component mounting machine so as to be exchangeable with a feeder.

2. The component mounting positional deviation amount measurement unit according to claim 1,
   wherein an attaching structure of the component mounting positional deviation amount measurement unit to the feeder setting section is common to an attaching structure of the feeder.

3. The component mounting positional deviation amount measurement unit according to claim 1,
   wherein the measurement nozzle placement section is configured to allow placing of the measurement nozzles of at least the number thereof which can be held in the mounting head,
   wherein the measurement component placement section is configured to allow placing of the measurement components of at least the number same as the number of the measurement nozzles which can be held in the mounting head, and
   wherein the measurement mounting table is configured to allow mounting of the measurement components of at least the number same as the number of the measurement nozzles which can be held in the mounting head.

4. The component mounting positional deviation amount measurement unit according to claim 1,
   wherein the measurement nozzle placement section is configured to allow placing of multiple types of the measurement nozzles, and wherein the measurement component placement section is configured to allow placing of multiple types of the measurement components which can be sucked by the multiple types of the measurement nozzles.

5. The component mounting positional deviation amount measurement unit according to claim 1, further comprising:
a holding device configured to hold the measurement component mounted on the measurement mounting table.

6. The component mounting positional deviation amount measurement unit according to claim 1, further comprising:
a connector for supplying operation power from a component mounting machine side to a driving source of the shutter mechanism and receiving a signal for controlling an opening and closing operation of the shutter mechanism,
wherein the component mounting positional deviation amount measurement unit is set to the feeder setting section of the component mounting machine so that the connector is configured to be connected to a connector on the component mounting machine side.

* * * * *